(12) United States Patent
Meng et al.

(10) Patent No.: US 11,322,872 B2
(45) Date of Patent: May 3, 2022

(54) PLUG CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Wei Meng, Kunshan (CN); Zheng-Rong Zhu, Kunshan (CN); Jun Chen, Kunshan (CN); Yang-Tsun Hsu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/904,817

(22) Filed: Jun. 18, 2020

(65) Prior Publication Data
US 2020/0403338 A1 Dec. 24, 2020

(30) Foreign Application Priority Data
Jun. 18, 2019 (CN) .......................... 201910526699.8

(51) Int. Cl.
H01R 12/72 (2011.01)
H01R 43/02 (2006.01)
H01R 13/627 (2006.01)
H01R 13/506 (2006.01)
H01R 43/20 (2006.01)

(52) U.S. Cl.
CPC .......... *H01R 12/72* (2013.01); *H01R 13/506* (2013.01); *H01R 13/6275* (2013.01); *H01R 43/0256* (2013.01); *H01R 43/205* (2013.01)

(58) Field of Classification Search
None
See application file for complete search history.

(56) References Cited

U.S. PATENT DOCUMENTS

| | | | | |
|---|---|---|---|---|
| 7,261,582 B2* | 8/2007 | Wu | ...... | H01R 13/506 439/352 |
| 8,251,730 B2* | 8/2012 | Wu | ...... | H01R 13/6275 439/345 |
| 8,475,198 B2* | 7/2013 | Wu | ...... | H01R 13/6275 439/352 |
| 9,337,590 B2* | 5/2016 | Wu | ...... | H01R 13/6473 |
| 10,622,767 B2* | 4/2020 | Wu | ...... | H01R 24/64 |
| 10,741,941 B2* | 8/2020 | Wu | ...... | H01R 43/0263 |
| 10,868,387 B2* | 12/2020 | Hsiao | ...... | H01R 13/504 |
| 10,958,016 B2* | 3/2021 | Yang | ...... | H01R 13/6471 |
| 2012/0052712 A1* | 3/2012 | Wang | ...... | H01R 13/6275 439/352 |
| 2018/0131126 A1* | 5/2018 | Wang | ...... | H01R 13/5825 |

FOREIGN PATENT DOCUMENTS

CN 206712089 U 12/2017

* cited by examiner

*Primary Examiner* — Oscar C Jimenez
(74) *Attorney, Agent, or Firm* — Ming Chieh Chang; Wei Te Chung

(57) ABSTRACT

A plug connector used to mate with the socket connector includes: a housing; a printed circuit board received in the housing, the circuit print board having plural soldering points; and a cable electrically connected to the soldering points of the printed circuit board, wherein the soldering points are provided with glue blocks to protect a connection between the printed circuit board and the cable.

3 Claims, 5 Drawing Sheets

PLUG CONNECTOR

BACKGROUND OF THE DISCLOSURE

1. Field of the Disclosure

The present disclosure relates to a plug connector, in particular to a plug connector for easy assembly.

2. Description of Related Arts

China patent application publication No. 106785613A discloses a high-speed connector assembly which includes a board connector, and an wire end connector, the wire end connector includes an assembled housing, an inner mold filled in the housing, a printed circuit board covered with the inner mold and a cable soldered on the printed circuit board.

Since the wire end connector needs to be provided with injection holes, low-pressure injection of the inner film is into the assembled housing through the injection holes to cover all the welding points between the connecting cable and the printed circuit board. This design not only increases the manufacturing process, but also increases manufacturing costs.

Therefore, an improved plug connector is desired.

SUMMARY OF THE DISCLOSURE

Accordingly, an object of the present disclosure is to provide a plug connector for easy assembly.

To achieve the above object, a plug connector used to mate with a socket connector comprises: a housing; a printed circuit board received in the housing, the circuit print board having plural soldering points; and a cable electrically connected to the soldering points of the printed circuit board, wherein the soldering points are provided with glue blocks to protect a connection between the printed circuit board and the cable.

Other objects, advantages and novel features of the disclosure will become more apparent from the following detailed description when taken in conjunction with the accompanying drawings.

DETAILED DESCRIPTION OF THE PREFERRED EMBODIMENT

Reference will now be made in detail to the embodiments of the present disclosure.

Figure 1:
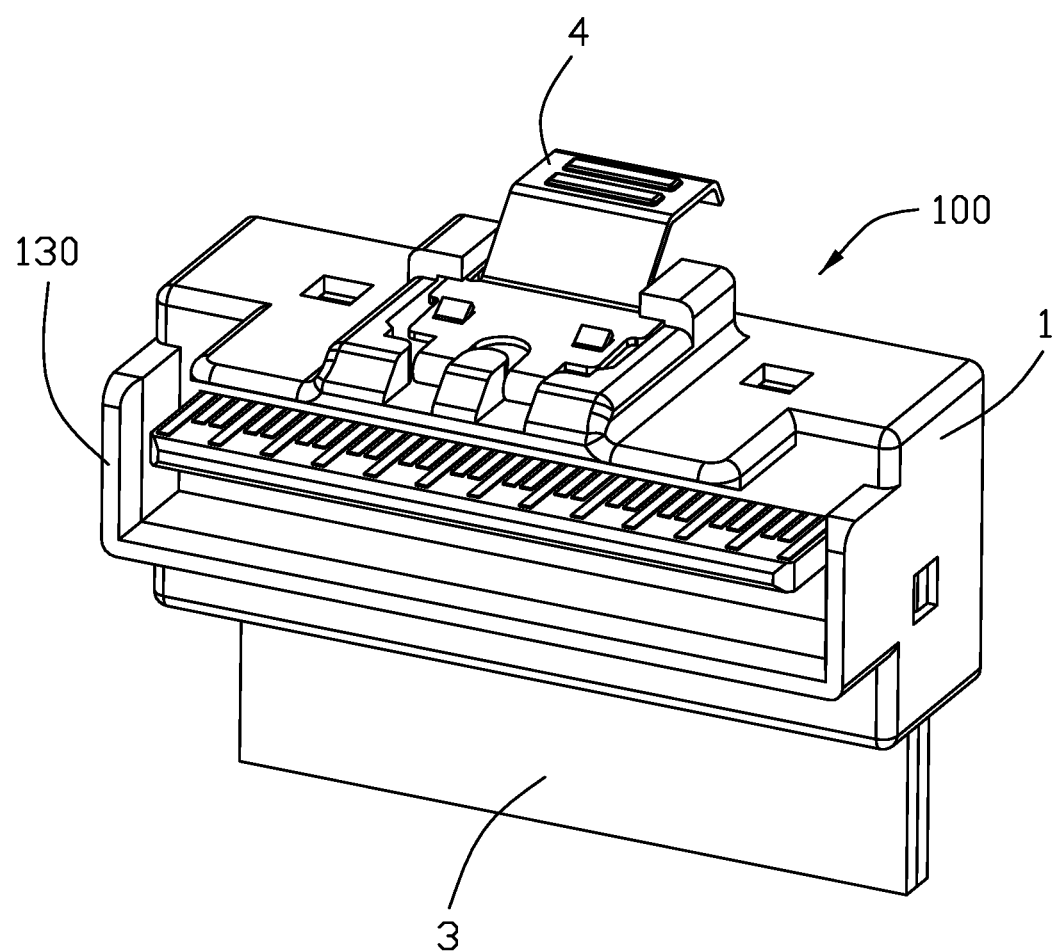
FIG. 1 is a perspective view of a plug connector according to the present invention.
Figure 2:
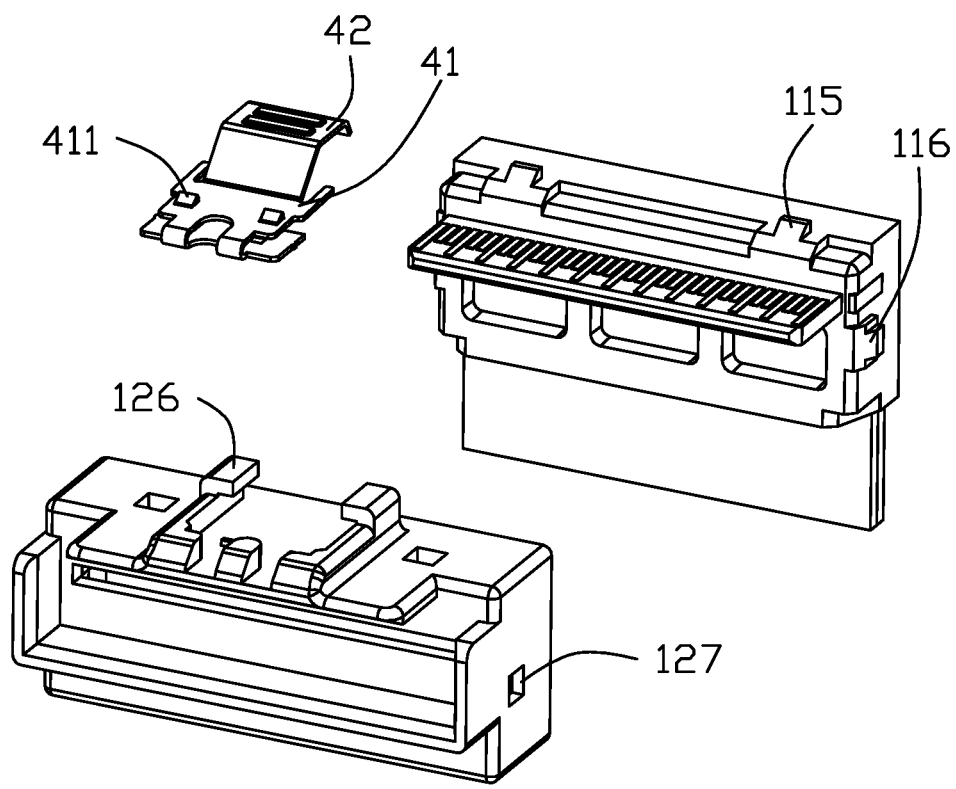
FIG. 2 is an exploded view of the plug connector as shown in FIG. 1.
Figure 3:
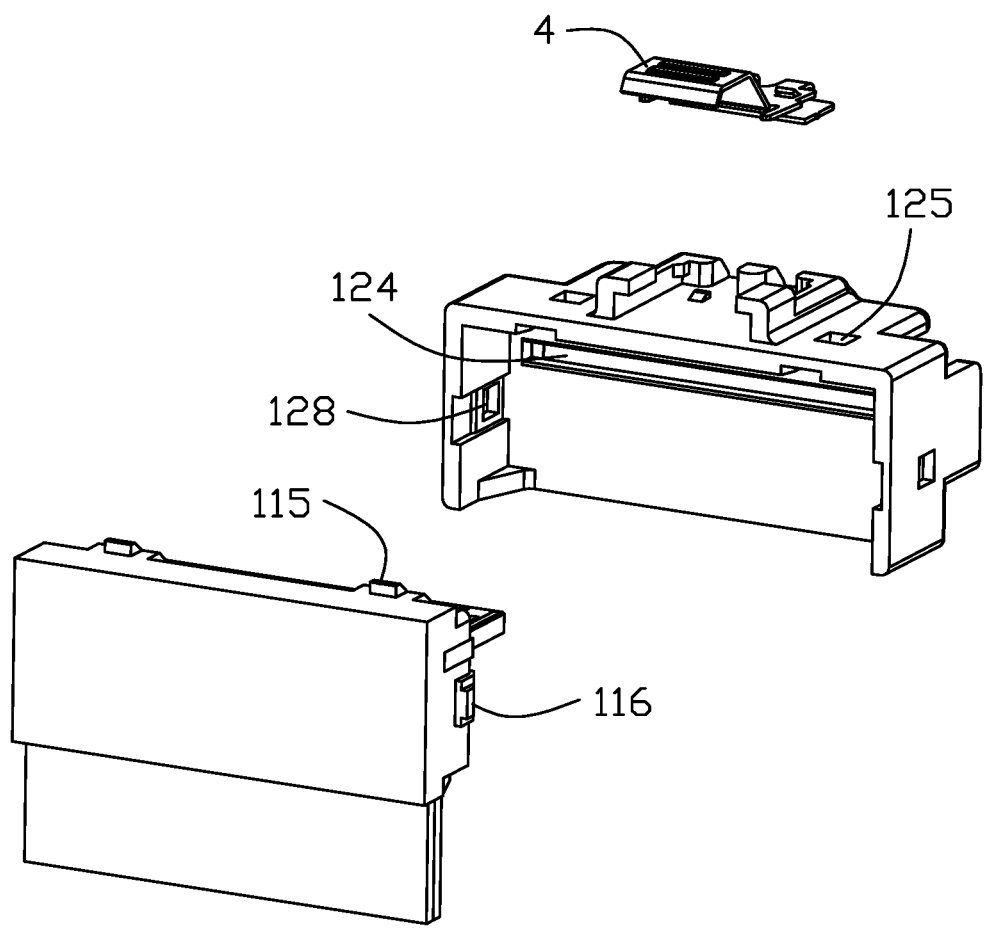
FIG. 3 is another exploded view of the plug connector as shown in FIG. 2.
Figure 4:
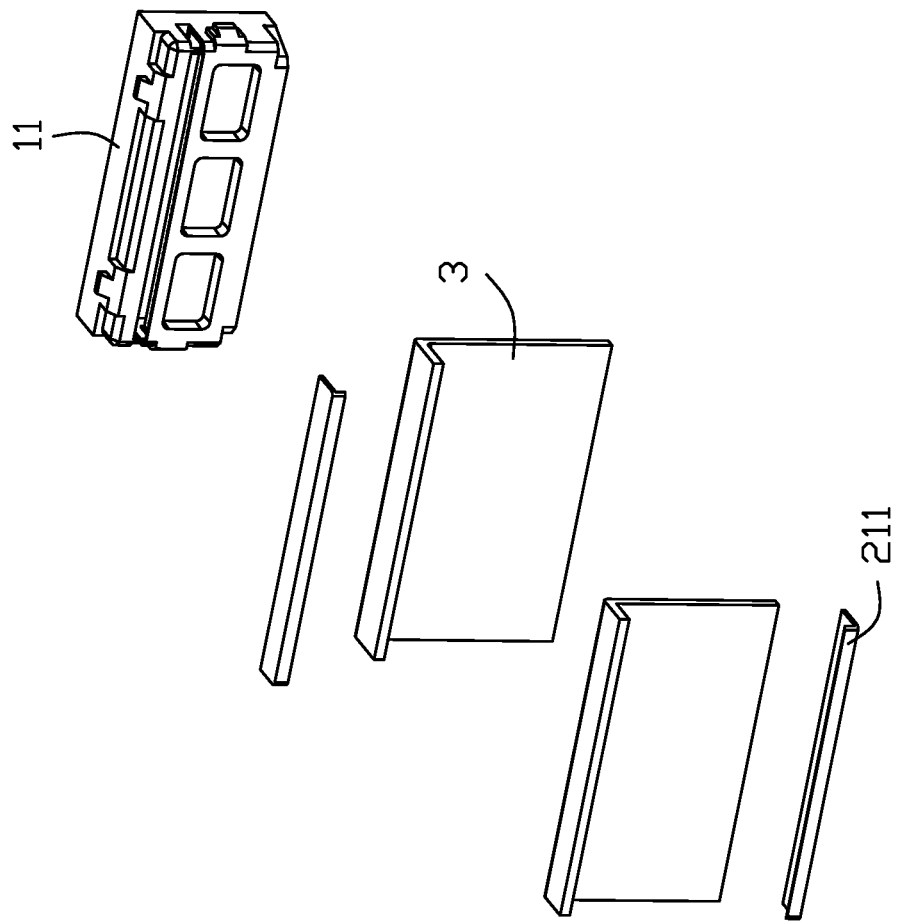
FIG. 4 is a further exploded view of the plug connector as shown in FIG. 2.
Figure 5:
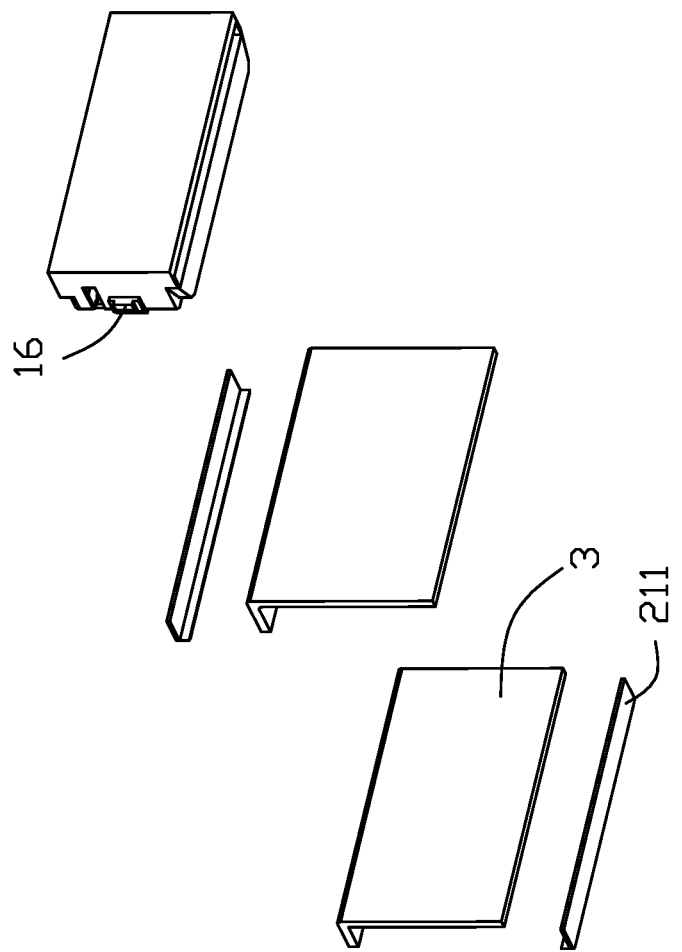
FIG. 5 is another further exploded view of the plug connector as shown in FIG. 4.

Referring to FIGS. 1-5, a plug connector 100 used to mate with the socket connector includes a housing 1, a printed circuit board 2 received in the housing 1, a cable 3 electrically connected with the printed circuit board 2 and a locking spring member 4.

The housing 1 is an assembled housing and includes a first housing 11 and a second housing 12. The first housing 11 is formed at the connection between the printed circuit board 2 and the cable 3. The first housing 11 includes a first upper surface 111, a first left side 112 on the left side of the first upper surface 111, a first right side 113 on the right side of the first upper surface 111 and a lower surface 114 opposite to the first upper surface 111. The first upper surface 111 is provided with ribs 115 on both sides thereof. Both the first left side 112 and the first right side 113 are provided with a block 116 in a "convex" shape. The lower surface 114 is provided with a through hole 117 through which the cable 3 extends out of the first housing 11. The second housing 12 includes a second upper surface 121, a second left side 122 on the left side of the second upper surface 121, a second right side 123 on the right side of the second upper surface 121 and a front end 124. The second upper surface 121 includes a groove 125 that cooperates with the ribs 115 and a step 126 for holding the locking spring member. Both the inner side of the second left side surface 122 and the second right side surface 123 are provided with a recessed hole 127 for holding the block 116 and a sliding groove 128 for guiding the block 116 to cooperate with the recessed hole 127. The front end 124 is provided with an opening 129 through which the printed circuit board 3 extends out of the second housing 121. The second housing 12 further includes a baffle 130 extending forward from both sides and a lower side of the front end 124, and the baffle plate 130 is U-shaped.

The connection direction of the printed circuit board 2 is perpendicular to the connection direction of the cable 3. The printed circuit board 2 includes, at the rear side, a plurality of soldering points or circuit pads 21 connected to the cable 3, and the soldering points 21 are provided with glue blocks to protect the connection between the printed circuit board 2 and the cable 3, and the cost can be saved. The printed circuit board 2 further includes, at the front side, a plurality of circuit pads (not labeled) for mating with the corresponding resilient contacts of the complementary connector.

The front end of the cable 3 is connected to the printed circuit board 2, and the rear end extends downward from the second housing 12.

The locking spring member 4 includes an elastic piece 41 fixed to the step 126 and a pressing piece 42 provided at the rear end of the elastic piece 41. The upper surface of the elastic piece 41 is provided with a locking protrusion 411 for cooperating with the locking hole of the socket connector. The elastic piece 41 can drive the locking protrusion 411 to swing elastically up and down. When the user manually presses the pressing piece 42, the elastic piece 41 can be caused to swing downward to unlock the socket connector.

The production method of the plug connector 100 in the above embodiment includes the following steps: provide a printed circuit board 2 and a cable 3 perpendicular to the connection direction of the printed circuit board 2, solder the cable 3 to the soldering points 21 of the printed circuit board 2, and protect the connection between the printed circuit board 2 and the cable 3 by providing glue blocks 211 on the soldering points 21; provide a first housing 11 is formed at the connection between the cable 2 and the printed circuit board 3, and a through hole 117 is provided on the lower surface 114 of the first housing 11 to pass the cable 3 through the through hole 117 and extend out of the first housing 11; provide a second housing 12 with an opening 129, install the printed circuit board 2 into the second housing 12 through the opening 129; ribs 115 is provided on the upper surface of the first housing 11, and a groove 125 corresponding to the ribs 115 is provided on the upper surface of the second housing 12; blocks 116 are provided on both sides of the first housing 11, and corresponding holes 127 and slide grooves 128 are provided on both sides of the second housing 12; the ribs 115 cooperates with the hole 127 through the sliding groove 128 to assemble the first housing 11 and the second housing 12 together.

What is claimed is:

1. A method of assembling a plug connector, comprising the steps of:
   providing a printed circuit board and soldering a cable to plural soldering points of the printed circuit board;
   providing glue blocks on the soldering points to protect a junction between the printed circuit board and the cable;
   over-molding a first housing at the junction to have a block; and
   providing a second housing with an opening and installing the printed circuit board into the second housing through the opening and with a recessed hole and assembling the first housing and the second housing together through cooperation of the block and the recessed hole.

2. The method as claimed in claim 1, further comprising fixing a locking spring member on a step provided on the second housing.

3. The method as claimed in claim 2, wherein the locking spring member is provided with a locking protrusion.

* * * * *